United States Patent [19]
Viduya et al.

[11] Patent Number: 5,629,486
[45] Date of Patent: May 13, 1997

[54] PRESSURE SENSOR APPARATUS WITH INTEGRATED CIRCUIT MOUNTED THEREON

[75] Inventors: Andres D. Viduya, Carmel; Lewis H. Little, Peru, both of Ind.

[73] Assignee: Delco Electronics Corporation, Kokomo, Ind.

[21] Appl. No.: 591,876

[22] Filed: Jan. 25, 1996

[51] Int. Cl.$^6$ ............................................. G01L 9/06
[52] U.S. Cl. ........................... 73/727; 73/720; 73/721; 73/726
[58] Field of Search ............................. 73/715, 717, 719, 73/720, 721, 725, 726, 727

[56] References Cited

U.S. PATENT DOCUMENTS

| | | | |
|---|---|---|---|
| 3,341,794 | 9/1967 | Stedman | 73/720 X |
| 4,965,777 | 10/1990 | Timossi et al. | 73/727 X |
| 4,993,267 | 2/1991 | Allard et al. | 73/726 |
| 5,143,888 | 9/1992 | Zylka et al. | 73/726 |
| 5,209,122 | 5/1993 | Matly et al. | 73/727 |

*Primary Examiner*—Richard Chilcot
*Assistant Examiner*—Paul D. Amrozowicz
*Attorney, Agent, or Firm*—Mark A. Navarre

[57] ABSTRACT

A pressure sensor comprises a diaphragm mounted on a housing and subject to pressure. Stress sensitive resistors are connected to circuit traces on the diaphragm which in turn are wirebonded to a compensation IC. The IC is directly mounted on the diaphragm principally or wholly in an area which is not subject to flexing. A connector has a dome partially covering the diaphragm and holds terminal blades having ends extending away from the diaphragm and opposite ends carrying bond pads located adjacent the diaphragm. An opening in the dome permits wirebonder access to connect bond pads on the traces with terminal bond pads. A cover is installed over the connector and sensor.

13 Claims, 2 Drawing Sheets

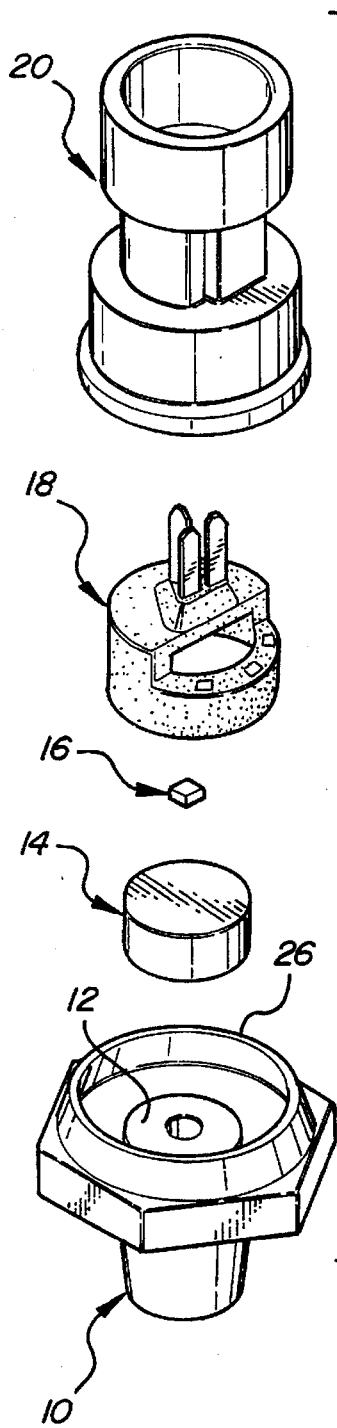
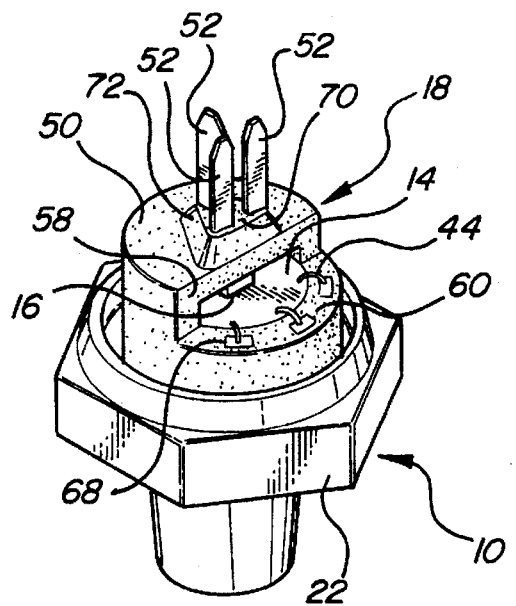
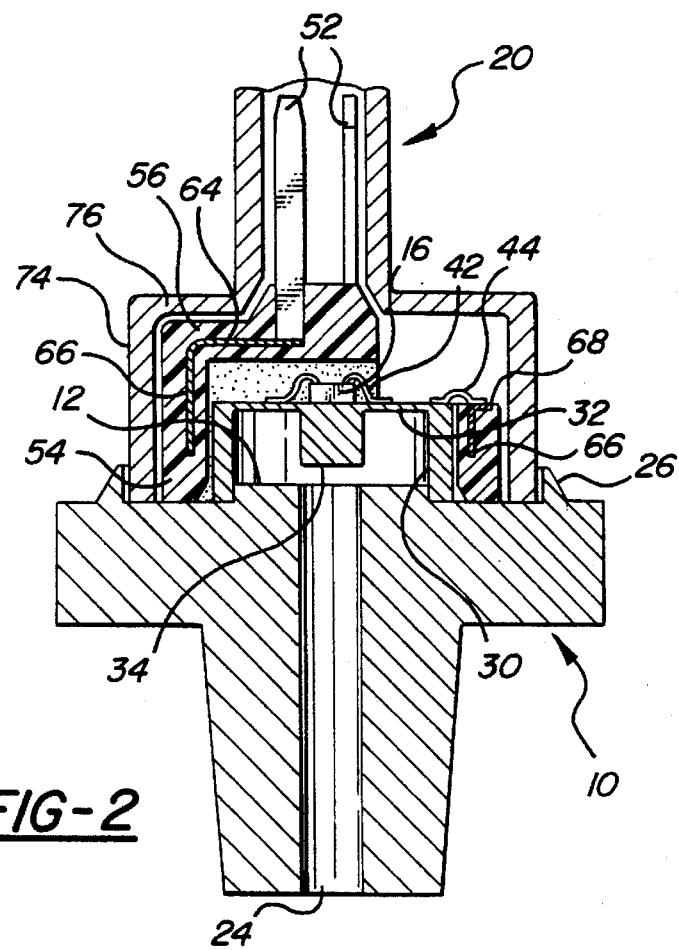

PRESSURE SENSOR APPARATUS WITH INTEGRATED CIRCUIT MOUNTED THEREON

FIELD OF THE INVENTION

This invention relates to a pressure sensor apparatus and particularly to such a device which incorporates an integrated circuit (IC) in a pressure sensor.

BACKGROUND OF THE INVENTION

In automotive vehicles as well as other applications it is necessary to obtain a measurement of air pressure, manifold pressure or some other pressure. Commonly such sensors include a base, a diaphragm movable in response to pressure fluctuations, a sensor element on the diaphragm responsive to diaphragm stress, a compensator circuit for adjusting the output of the sensor element to obtain a pressure signal, a cover to enclose the diaphragm, and terminals extending through some part of the base or cover to supply power to the device and bring out the pressure signal. It is important, especially where the sensor apparatus is produced in high volume, to minimize the cost of the assembly while maintaining high quality.

It is known to mount a pressure sensor or other circuit on a base or housing which also incorporates terminals extending laterally from the circuit or normal to the plane of the circuit but laterally offset from the circuit. However an inline configuration is desired such that outer terminal blades are normal to and aligned with the circuit or diaphragm and they are on the same side of the base as the circuit or diaphragm. Then the base can be connected to the pressure source and the terminals will extend away from the source.

It has been proposed to use a flex circuit that is soldered to a DIP package compensation IC and uses adhesive and gold wire bond to attach to the sensing element. This requires special manufacturing processes and high cost of the flex circuit and packaged ICs. Another proposal uses a pin and socket interconnect. The sensing element is wire bonded to a circuit board that includes the socket portion of the interconnect. The pin, made by extending and forming the terminals on the connector, is manually mated to the socket. Automating this type would be costly and would present potential quality problems.

To maintain high quality and low cost, it is desirable to construct a pressure sensor apparatus which is readily assembled by automated processes and which avoids unnecessary component cost.

SUMMARY OF THE INVENTION

It is therefore an object of the invention in a pressure sensor apparatus to simplify the connection of a compensation IC to the sensing element for low cost and for automated assembly. Another object in such an apparatus is to eliminate flex circuits or circuit boards for coupling an IC to the sensing element and to the terminals.

A pressure sensing diaphragm is supported on a base and has a boss in the center, which prevents flexing due to pressure change at the region of the boss. The compensator IC is mounted directly to the diaphragm by adhesive in the region of no flexing. It is possible, by using a soft adhesive, to allow a portion of the IC to overlap some of the flexing region; in that case the adhesive is sufficiently compliant to isolate the IC from the diaphragm movement so that neither element is adversely affected by the presence of the other. In the case of diaphragms which have no boss and thus no stress free region, the IC still can be mounted on the diaphragm using the soft adhesive if the amount of diaphragm movement is very small.

Stress sensitive resistors in or on the diaphragm vary in resistance according to the diaphragm stress. The surface of the diaphragm carries a circuit in the form of conductive pathways which are coupled to the resistors in a Wheatstone bridge configuration and may also be configured to form the resistors. In either case the circuit forms bond sites which are connected to bond sites on the IC by wirebonding to provide the pressure responsive resistance information to the IC. The pathways also form bond pads for connection by wirebonding to connector terminals placed adjacent the diaphragm.

The terminals carrying supply voltage and ground to the pressure sensor and the compensator IC and the output voltage of the IC are mounted in a nonconductive dome which is seated on the base and extends over the circuit and IC. The dome has an opening which allows access by a wirebonder for completing connections between the circuit and the terminals. Each terminal blade has an end directed away from the diaphragm and another end located at an edge of the opening near the bond pads on the circuit.

A cover, also seated on the base surrounds the sides of the sensor and has a top opening accommodating the terminals. The cover may seal against the dome to seal the sensor from its outer environment.

BRIEF DESCRIPTION OF THE DRAWING

The above and other advantages of the invention will become more apparent from the following description taken in conjunction with the accompanying drawings wherein like references refer to like parts and wherein:

FIG. 1 is an exploded view of a pressure sensor apparatus according to the invention;

FIG. 2 is a sectional view of the apparatus of FIG. 1 less part of the cover;

FIG. 3 is an isometric view of the apparatus of FIG. 2 less the cover;

DESCRIPTION OF THE INVENTION

Figure 4:
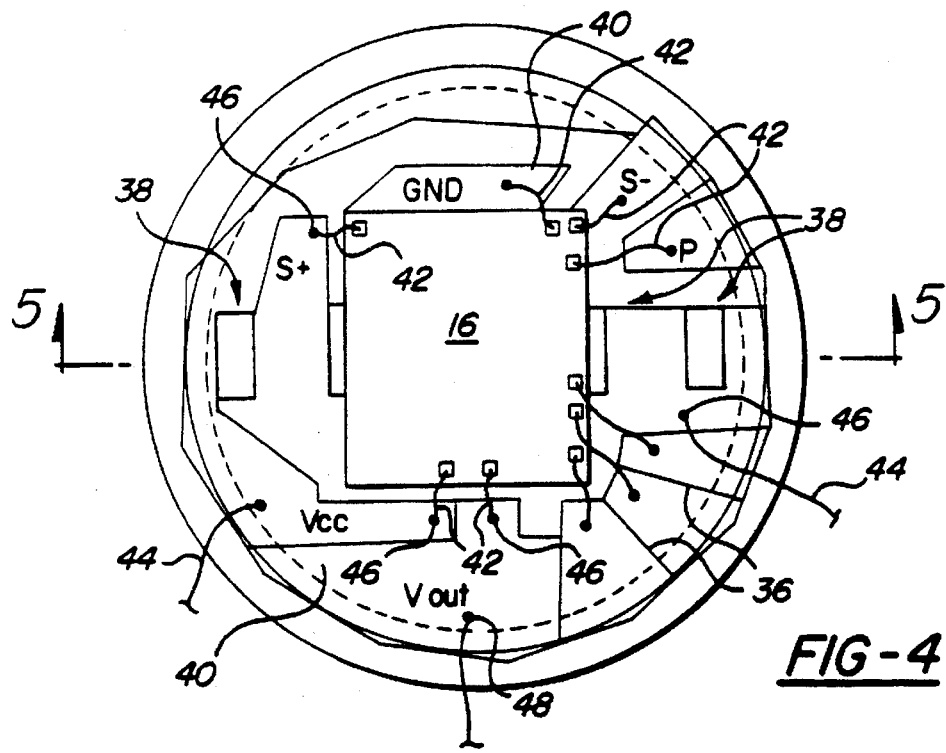
FIG. 4 is a top view of an IC mounted on a diaphragm according to the invention.

Referring to FIG. 1, a pressure sensor apparatus includes a base 10 having a central boss 12, a pressure sensor 14 which seats over the boss 12, a compensation IC chip 16 which is directly mounted on the pressure sensor 14, a terminal assembly 18 which surrounds the pressure sensor and seats on the base 10, and a cover 20 which surrounds the terminal assembly and also seats on the base 10. The parts are shown in assembly in FIG. 2 (less part of the cover 20) and in FIG. 3 except for the cover 20.

The base 10 is a stainless steel pressure port having a hex flange 22 around its top portion and an axial passage 24 for coupling to the pressure to be sensed. An upper annular rib 26 is formed on the upper surface of the base concentric with the central boss 12. The lower region of the port may be threaded or plain and is adapted to be mounted to an engine, oil pan, transmission or other device requiring a pressure measurement.

The pressure sensor may have any of a variety of embodiments. In the present example the pressure sensor 14 is a stainless steel element having a cylindrical wall 30 open at one end, a diaphragm 32 extending across the other end, and a boss 34 centrally located on the diaphragm and within the wall 30. The wall 30 surrounds the boss 12 on the base and the end of the passage 24 and is welded to the base to securely seal around the passage. Thus the sensor 14 and the base define a chamber in communication with the passage. The top of the diaphragm is nominally flat, subject to subtle deformation by pressure. The region corresponding to the area of the boss 34 cannot flex due to the stiffness of the boss and thus does not respond to pressure fluctuation, but the diaphragm region between the boss 34 and the wall 30 is stressed by pressure fluctuations.

The top of the diaphragm 32 bears a circuit including resistors responsive to diaphragm flexing due to pressure change. An embodiment of the circuit which is suitable for use with the steel diaphragm 32 is shown in FIG. 4. The IC 16, used for amplification and temperature compensation, is mounted on the diaphragm over the circuit and covers the central part of the circuit. The surface of the IC facing away from the diaphragm contains bond sites. The diaphragm is covered with an insulating coating (not shown) and then a conductive film. The film is scribed by trimming along lines 36 which define four resistors 38 and a plurality of conductive pathways 40. The pathways 40, along with wirebonds 42, connect the resistors to the IC, and with wirebonds 44 connect the resistors or the IC to the supply voltage $V_{cc}$, ground or the output voltage $V_{OUT}$ to terminal pads on the terminal assembly 18. Additional pathways are wirebonded to bond sites on the IC for programming purposes. Because the pathways 40 cover wide areas, the bond sites 46 where the wirebonds 42 are attached on the wide pathways are readily chosen at places adjacent the fixed bond sites on the IC. Similarly, the bond pads 48 on the pathways for attaching the wirebonds 44 are readily selected places adjacent the terminal pads.

Figure 5:
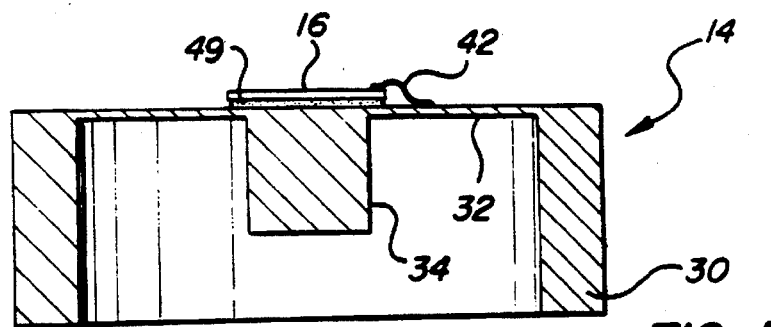
FIG. 5 is a cross section taken along line 5—5 FIG. 4.

The FIG. 4 embodiment is shown in cross section in FIG. 5. The IC is mounted over the boss 34 by an adhesive 49. In this case the IC is larger than the boss so that peripheral portions overlie the flexible portion of the diaphragm; then the adhesive must be sufficiently soft or compliant to avoid interference to the diaphragm movement and to prevent harmful amounts of stress to the IC. A silicone adhesive formulated witch a high coefficient of elasticity is suitable for this purpose. In the FIG. 2 embodiment the IC is smaller than the boss 34 and lies entirely within the region defined by the boss. Since the region of the diaphragm containing the boss does not flex the IC will have a stable mount unaffected by pressure fluctuations. In still another embodiment, not shown, the diaphragm movement is very small and has no boss or no stress-free region. Because of the small movement the IC can still be mounted directly on the diaphragm with soft adhesive without adverse effects on either the IC or the sensor performance.

Referring again to the FIGS. 2 and 3, the terminal assembly 18 comprises a nonconductive dome 50 with terminal blades 52 molded within the dome. The dome 50 has a cylindrical wall 54 surrounding the sensor 14 and seated on the base 10, and a top 56. To permit wirebonder access for the attaching of wirebonds 44, an opening 58 is provided in the dome top 56 and wall 54 on one side of the terminal assembly. The opening forms a shortened wall portion defining a shelf 60 at its top. The terminal blades have outer ends 52 aligned with the diaphragm and extending from the top 56 substantially normal to and away from the diaphragm. An inner portion for each terminal embedded in the dome comprises a run 54 in the top 56 and a semicylindrical run 66 in the wall 54 which extends to the opening 58. The other end of the terminal is a terminal pad 68 situated on the shelf 60. Thus after the terminal assembly is installed on the base the wire bonds 44 can be attached to the bond pads on the diaphragm 32 and the terminal pads 68. A generally triangular protuberance 70 on the top around the base of the connector terminals has sloping side-walls 72.

The cover 20, partially shown in FIG. 2, has a large diameter lower edge 74 nested between the terminal assembly 18 and the annular rib 26. Above the top dome 56 the cover reduces in diameter at a shoulder 76 and engages the walls 72 of protuberance 70 to enclose the dome opening 58. If desired, the shoulder seals against the protuberance to seal the diaphragm region from the outer environment.

Figure 6:
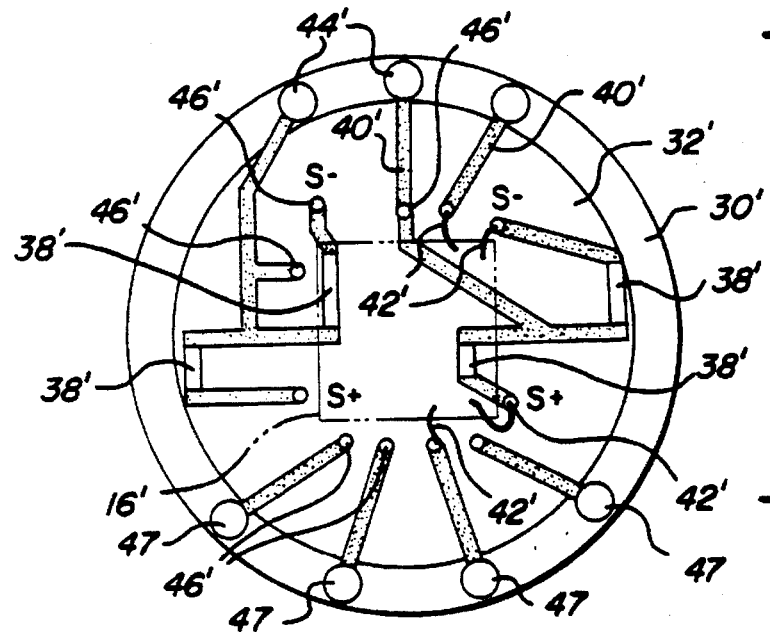
FIG. 6 is a top view of an IC mounted on a diaphragm according to another embodiment of the invention.

FIG. 6 shows another embodiment of a pressure sensor which also has a diaphragm 32' supported by cylindrical wall 30' and having a central boss, not shown. An IC 16' shown in phantom lines is mounted at the center. The diaphragm is stainless steel coated with an insulating layer and a polysilicon layer covers at least part of the diaphragm area. Four piezo-resistive elements 38' are formed in the polysilicon. Gold conductive traces 40' formed on the silicon surface extend from bond pads 44' at the diaphragm edge to bond sites 46' near the edge of the IC for wirebonding to the IC. The traces 40' also extend to ends of the resistor elements 38' and some traces connect resistor elements to bond sites identified as S+ and S−. Four programming pads 47 are coupled by traces to bond sites 46' for connection to the. IC. Only a few of the wire bonds 42' to the IC are shown. The pressure sensor is packaged in the same manner as shown in FIG. 2 so that wire bonds will be made between the bond pads 44' and the corresponding terminal pads on the terminal assembly.

It will thus be seen that the pressure sensor apparatus is simplified by directly mounting the IC on the pressure sensing diaphragm and making the electrical connections to the terminal assembly by wirebonding after assembling the terminal assembly on the base. The terminal assembly is compact and permits the final wirebond connection to be made after the assembly is installed. Intermediate circuits such as expensive flex circuits are avoided as well as pin and socket connections. The apparatus is readily adapted to automated assembly so that high costs of manual assembly are avoided. In addition to eliminating expensive materials and processes used in prior art devices, the size of the sensor apparatus is reduced by having fewer components to package.

The embodiments of the invention in which an exclusive property or privilege is claimed are defined as follows:

1. A pressure sensor apparatus, comprising:
    a diaphragm element subject to pressure to be sensed and supported on a base, the diaphragm being stressed by fluctuations in the pressure;
    sensor means including a plurality of sensor elements formed on a surface of the diaphragm;
    an IC directly mounted on and attached to the surface of the diaphragm and having a plurality of bond sites on a surface which faces away from the diaphragm;
    conductor traces formed on the surface of the diaphragm defining conductive bond sites and at least one bond pad on the diaphragm, at least some of the traces being electrically connected to the sensor elements;
    wirebond electrical connections between the bond sites on the IC and the bond sites on the diaphragm;
    a connector assembly mounted on the base including at least one terminal bond pad in proximity to said at least one bond pad on the diaphragm; and a wirebond electrical connection between the bond pad on the diaphragm and the terminal bond pad.

2. The invention as defined in claim 1 wherein the IC is mounted on the surface by a compliant adhesive for isolating the IC from any stress of the diaphragm.

3. The invention as defined in claim 1 wherein the connector assembly includes:

a nonconductive dome element mounted on the base and extending over the diaphragm and the IC; and at least one terminal blade supported by the dome element and having a first end extending away from the base and a second end defining the terminal bond pad in proximity to the bond pad of the electronic circuit.

4. The invention as defined in claim 3 wherein:

the dome element is seated at its periphery on the base and extends above the base, and the dome element has an opening to permit wirebonder access to the bond pad and the terminal bond pad during the manufacture of the apparatus.

5. A pressure sensor apparatus, comprising:

a diaphragm element subject to pressure to be sensed and supported on a base, the diaphragm having a first region which is stressed by fluctuations in the pressure, and a second region which is substantially insensitive to such fluctuations;

sensor means including a plurality of sensor elements formed on a surface of the diaphragm within the first region;

an IC directly mounted on and attached to the surface of the diaphragm substantially within the second region and having a plurality of bond sites on a surface which faces away from the diaphragm;

conductor traces formed on the surface of the diaphragm defining conductive bond sites and at least one bond pad on the diaphragm, at least some of the traces being electrically connected to the sensor elements;

wirebond electrical connections between the bond sites on the IC and the bond sites on the diaphragm;

a connector assembly mounted on the base including at least one terminal bond pad in proximity to said at least one bond pad on the diaphragm; and a wirebond electrical connection between the bond pad on the diaphragm and the terminal bond pad.

6. The invention as defined in claim 5 wherein the IC is mounted wholly within the second region.

7. The invention as defined in claim 5 wherein:

the second region is defined by a boss on the diaphragm in the center of the diaphragm; and the IC is mounted at the center of the diaphragm.

8. The invention as defined in claim 5 wherein:

the second region is in the center of the diaphragm; and the IC is mounted in the second region and has peripheral portions extending beyond the second region.

9. The invention as defined in claim 5 wherein the IC is mounted on the surface by a compliant adhesive for isolating each of the IC and the diaphragm from stress due to the other.

10. The invention as defined in claim 5 wherein the diaphragm and the base define a chamber on the side of the diaphragm opposite the surface holding the IC, the chamber being exposed to the pressure to be sensed.

11. The invention as defined in claim 5 wherein the connector assembly includes:

a nonconductive dome element mounted on the base and extending over the diaphragm and the IC; and at least one terminal blade supported by the dome element and having a first end extending away from the base and a second end defining the terminal bond pad in proximity to the bond pad of the electronic circuit.

12. The invention as defined in claim 11 wherein:

the dome element is seated at its periphery on the base and extends above the base, and the dome element has an opening to permit wirebonder access to the bond pad and the terminal bond pad during the manufacture of the apparatus.

13. The invention as defined in claim 12 including a cover over the dome element and seated on the base.

* * * * *